US008916966B2

(12) United States Patent
Mays

(10) Patent No.: US 8,916,966 B2
(45) Date of Patent: Dec. 23, 2014

(54) INTEGRATED CIRCUIT INCLUDING A HEAT DISSIPATION STRUCTURE

(75) Inventor: Kenneth W. Mays, Tigard, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 1187 days.

(21) Appl. No.: 10/953,135

(22) Filed: Sep. 28, 2004

(65) Prior Publication Data

US 2006/0072296 A1 Apr. 6, 2006

(51) Int. Cl.
| | | |
|---|---|---|
| H01L 23/34 | (2006.01) | |
| H01L 23/48 | (2006.01) | |
| H01L 23/10 | (2006.01) | |
| H01L 23/367 | (2006.01) | |
| H01L 23/373 | (2006.01) | |

(52) U.S. Cl.
CPC ............ *H01L 23/367* (2013.01); *H01L 23/373* (2013.01)
USPC ........... 257/717; 257/706; 257/719; 257/720; 257/778

(58) Field of Classification Search
CPC ... H01L 29/7371; H01L 24/48; H01L 23/367; H01L 24/81; H01L 23/3735
USPC .......................... 257/778, 717–719, 706, 720
See application file for complete search history.

(56) References Cited

U.S. PATENT DOCUMENTS

| | | | |
|---|---|---|---|
| 4,811,166 A * | 3/1989 | Alvarez et al. ................ 361/717 |
| 5,506,451 A * | 4/1996 | Hyugaji ........................ 257/778 |
| 5,719,433 A * | 2/1998 | Delage et al. ................ 257/625 |
| 5,796,714 A * | 8/1998 | Chino et al. ............. 372/50.124 |
| 5,939,739 A * | 8/1999 | O'Keefe ........................ 257/197 |
| 6,031,255 A * | 2/2000 | Delage et al. ................. 257/198 |
| 6,048,777 A * | 4/2000 | Choudhury et al. .......... 438/460 |
| 6,051,871 A | 4/2000 | DeLaCruz et al. |
| 6,519,842 B2 * | 2/2003 | Fukunaga et al. .............. 29/840 |
| 6,559,534 B1 * | 5/2003 | Floriot et al. ................. 257/706 |
| 6,592,019 B2 | 7/2003 | Tung |
| 6,864,571 B2 * | 3/2005 | Arik et al. ..................... 257/712 |
| 6,884,661 B1 | 4/2005 | Morris et al. |
| 2003/0173663 A1 * | 9/2003 | Kami et al. .................... 257/728 |
| 2003/0203181 A1 * | 10/2003 | Ellsworth et al. .......... 428/307.3 |
| 2004/0038496 A1 * | 2/2004 | Lee et al. ...................... 438/455 |
| 2006/0244537 A1 | 11/2006 | Salove |

* cited by examiner

*Primary Examiner* — Shouxiang Hu
(74) *Attorney, Agent, or Firm* — Schwabe Williamson & Wyatt

(57) ABSTRACT

One embodiment of an integrated circuit includes a discrete device that defines a top surface, an integrated circuit substrate, and a heat dissipation structure fully covering the top surface of the discrete device and being thermally connected to the integrated circuit substrate.

8 Claims, 3 Drawing Sheets

INTEGRATED CIRCUIT INCLUDING A HEAT DISSIPATION STRUCTURE

BACKGROUND

Integrated circuits (IC) may generate heat during use. In particular, discrete devices, such as a heterojunction bipolar transistor (HBT), on integrated circuits may generate heat during use. It may be desirable to dissipate heat generated from the discrete devices during use so as to prolong the life of the devices and so as to improve the working characteristics of the circuit.

DETAILED DESCRIPTION OF THE DRAWINGS

Figure 1:
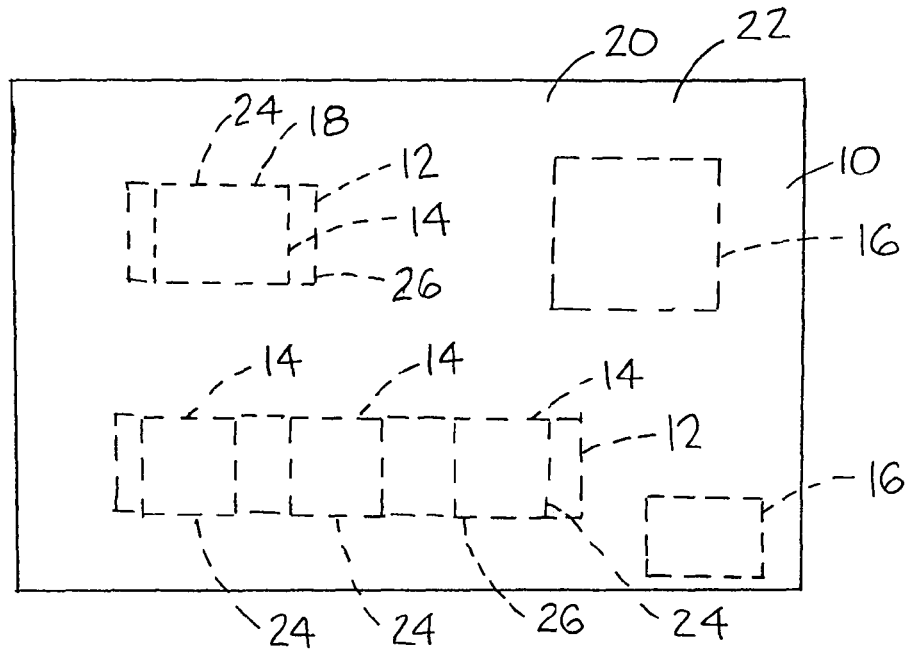
FIG. 1 is a schematic top view of one embodiment of an integrated circuit that may include one embodiment of a heat dissipation structure of the present invention and other discrete devices.

FIG. 1 is a schematic top view of one embodiment of an integrated circuit 10, such as a semiconductor device, that may include one embodiment of a heat dissipation structure 12 (shown in dash lines) of the present invention. Heat dissipation structure 12 may be positioned on any semiconductor device, such as a discrete device that generates heat, for example, an inductor, a resistor, a capacitor, a transistor, or a diode. For purposes of the description herein structure 12 is shown positioned on an HBT transistor 14 (shown in dash lines). In other embodiments the present invention may be utilized in other structures, such as in a BJT, a CMOS or a LDMOS. In an embodiment incorporating passive structures, such as capacitors and/or inductors, a non-semiconductor substrate, such as glass, may be utilized. Circuit 10 may further include other discrete devices 16 (shown in dash lines) positioned thereon. It may be desirable to dissipate heat generated by the individual devices, such as from transistor 14, so as to reduce the effects of heating on circuit 10 and so as to increase the performance of transistor 14. Accordingly, it may be desirable to position a plurality of heat dissipation structures 12 of the present invention on an integrated circuit. For ease of illustration, transistor 14 and other discrete devices 16 are shown in a relatively large size compared to the size of integrated circuit 10.

Still referring to FIG. 1, transistor 14 may define a footprint 18, which may also be referred to as a surface area of HBT 14, in a plane 20 of a printed circuit board 22, which may be referred to as a circuit substrate 22, of circuit 10. Footprint 18 may define an outer edge or perimeter 24 of transistor 14. Heat dissipation structure 12 may surround transistor 14 around perimeter 24 on two sides so that a footprint or surface area 26 of structure 12 may be larger than footprint 18 of transistor 14. In the embodiment wherein structure 12 may encompass three transistors 14, footprint 26 of structure 12 may be larger than the combined footprint 18 of the three transistors 14 so that structure 12 may surround the three transistors 14 on two sides of each of perimeters 24.

Figure 2:
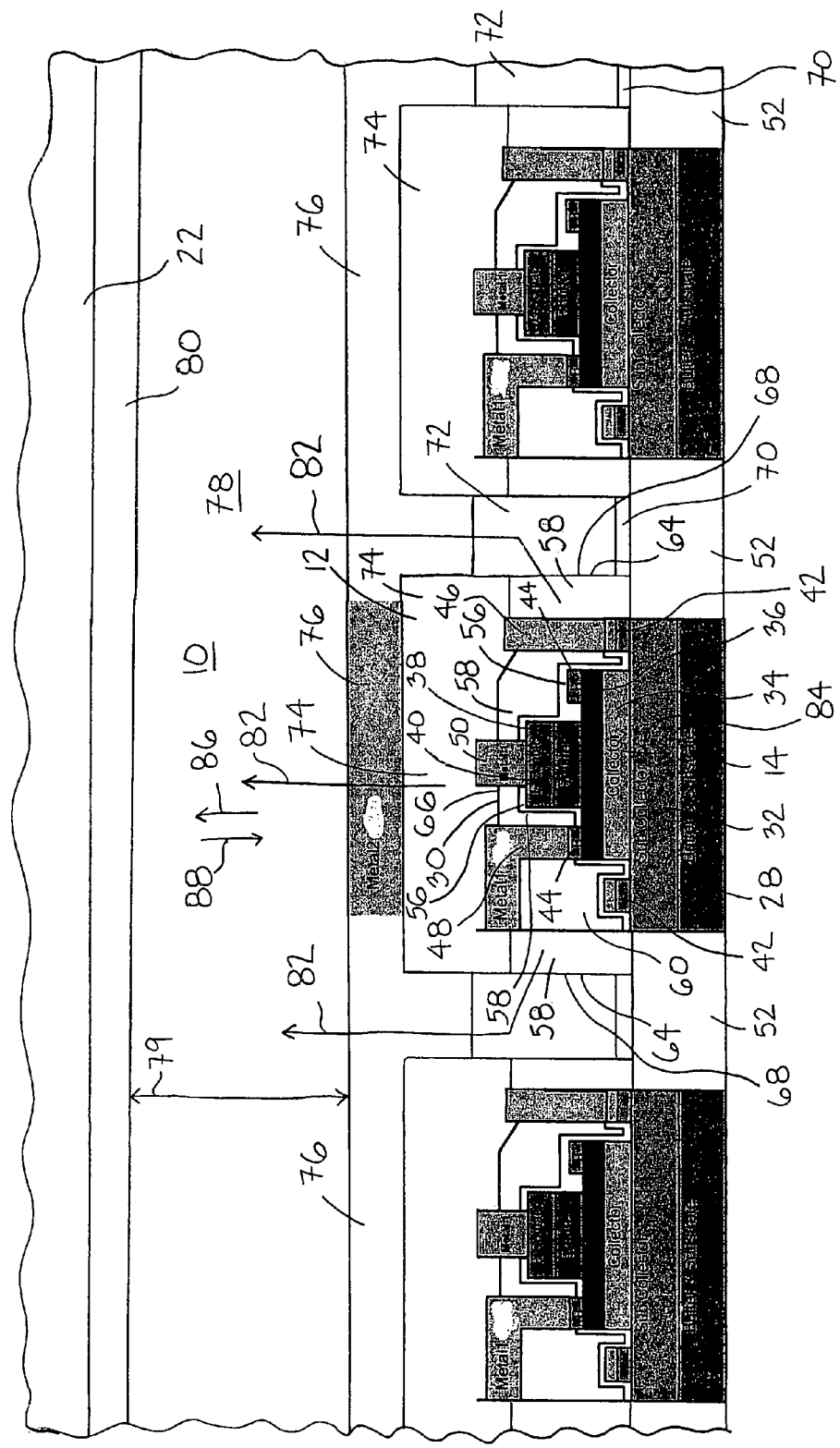
FIG. 2 is a schematic cross-sectional side view of one embodiment of an integrated circuit that may include one embodiment of a heat dissipation structure of the present invention.

FIG. 2 is a schematic cross-sectional side view of one embodiment of integrated circuit 10 that may include one embodiment of heat dissipation structure 12 of the present invention. In this view, three similar transistors 14 are shown positioned adjacent one another. For ease of illustration, center transistor 14 will be described. Transistor 14 may include a device substrate 28, such as a substrate manufactured of gallium arsenide, having a mesa or a projection 30 extending upwardly therefrom. Mesa 30 may include a subcollector layer 32, a collector layer 34 positioned on subcollector layer 32, a base layer 36 positioned on collector layer 34, an emitter layer 38 positioned on base layer 36, and an emitter contact layer 40 positioned on emitter layer 38. Emitter layer 38 and emitter contact layer 40 may be referred to together as an emitter or as the emitter layer.

Subcollector layer 32 may include two collector contacts 42 and base layer 36 may include two base contacts 44, also referred to as base fingers 44. A collector connection trench or via 46 may be connected to one of collector contacts 42. A base connection trench or via 48 may be connected to one of base contacts 44. An emitter connection trench or via 50 may be connected to a top surface of emitter contact layer 40. Each of contacts 42 and 44 and emitter contact layer 40 may be manufactured of electrically conductive material such as gold, aluminum, copper or the like. Similarly, each of connection vias 46, 48, 50 may be manufactured of electrically conductive material such as gold, aluminum, copper or the like. In the embodiment shown, each of connection vias 46, 48 and 50 extend upwardly from their corresponding contact and then perpendicularly into the plane of the drawing. Thereafter, connection vias 46, 48 and 50 are connected to other components of circuit 10, as will be understood in the art. In other embodiments, other paths for the vias may be utilized.

Each of devices 14 may be separated by an isolation region 52 positioned between the device substrate 28 and subcollector layer 32 of adjacent devices. An insulative layer, such as a dielectric layer 58 may extend over portions of isolation region 52 as shown. An electrically conductive layer, such as a metal layer 60, may extend over one of collector contacts 42, as shown.

Mesa 30 may define a side surface 64 that may extend around perimeter 24 of mesa 30 of transistor 14, encompassing the components and layers described above. Mesa 30 may further define a top surface 66 positioned opposite mesa 30 from device substrate 28.

Heat dissipation structure 12 may surround mesa 30 on top surface 66 and on two sides 68 of side surface 64. Heat dissipation structure 12 may include a first thermally conductive layer 70, a second thermally conductive layer 72, a third thermally conductive layer 74, a fourth thermally conductive layer 76, a fifth thermally conductive layer 78 and a sixth thermally conductive layer 80. Thermally conductive layer 78 may be referred to as a metal bump and may have a height or thickness 79, for example, in a range of 35 to over 100 micrometers. Thermally conductive layer 80 may be referred to as a solder cap and may be thermally connected to printed circuit board 22.

Thermally conductive layers 70, 72, 76, 78 and 80 may be manufactured of a metal, such as gold, aluminum or copper, such that these layers may also be electrically conductive. In particular, thermally conductive layer 74 may be manufactured of a thermally conductive but electrically non-conductive or insulative material, such as galium arsenide (GaAs), indium phosphide (InP), silicon carbide (SiC) and silicon (Si). Layers 70, 72, and 76 may be manufactured of gold. Layer 78 may be copper and layer 80 may be tin. Accordingly, heat dissipation structure 12 of the present invention may provide a fully metallized sidewall structure while still maintaining the electrical continuity of the circuit, i.e., heat dissipation structure 12 may not be in electrical contact with discrete device 14 but may provide a heat dissipation path. In one embodiment, each of layers 70, 72, 74, 76, 78 and 80, and circuit substrate 22, may be sequentially positioned, such as by depositing each of the layers on the preceding layer. For example, layer 70 may be deposited. Layer 72 may then be deposited on layer 70. Layer 74 may then be deposited on layer 72, and the like, such that circuit substrate layer 22 is lastly positioned on layer 80. In another embodiment, layers 70 through 78 may be deposited. Layer 80 may then be deposited on an underside of circuit substrate 22 whereafter layers 80 and 22 are then positioned on layer 78. Such an embodiment may be referred to as a solder printing method.

The number of layers utilized and the position of each of layers 70, 72, 76, 87 and 80 in the present invention are utilized for ease of processing of the particular embodiment shown. However, due to the similar properties of thermally conductive layers 70, 72, 76, 78 and 80, these layers may be deposited as a single layer, of a single material, or as any number of layers or materials as desired. Accordingly, in another embodiment, a thermally conductive and electrically insulative layer 74 may be positioned on top surface 66 of mesa 30 and a single, thermally and electrically conductive layer may be positioned in the areas shown by layers 70, 72, 76, 78 and 80, i.e., along side surfaces 68 of mesa 30 and on top of dielectric layer 74 which may be positioned on top surface 66 of mesa 30.

Mesa 30, therefore, is surrounded on sides 68 and on top surface 66 by thermally conductive material such that heat generated by emitter layer 38 may be thermally shunted to PCB 22 through these layers by thermal dissipation path 82. Thermal dissipation path 82 may extend away from, i.e., in an opposite direction from, base layer 36 and collector layer 34 such that heat may not travel through these layers to be dissipated from device 14. Accordingly, use of a thermal dissipation path 82 that extends in a direction opposite from base layer 36 and collector layer 34 may be more effective than heat dissipation structures of the prior art which may require that heat be dissipated to device substrate 28 in the direction of and through a base and a collector along heat dissipation path 84.

Moreover, circuit substrate 22 may be larger in size than a size of device substrate 28 such that circuit substrate 22 may define a larger heat sink than device substrate 28. Additionally, emitter layer 38, which may generate heat that may be desired to be dissipated, may be positioned closer to heat dissipation structure 12 than to device substrate 28, such that heat dissipation to structure 12 along path 82 may be the path of least resistance, compared with a heat dissipation path 84 that may extend to device substrate 28 through base layer 36 and collector layer 34. Accordingly, by providing a thermally conductive material on side surface 68 and on top surface 66 of mesa 30, heat may be readily dissipated from mesa 30 along path 82 in a direction 86 more effectively than may take place along a heat dissipation path 84 in a direction 88 through device 14 itself.

Figure 3:
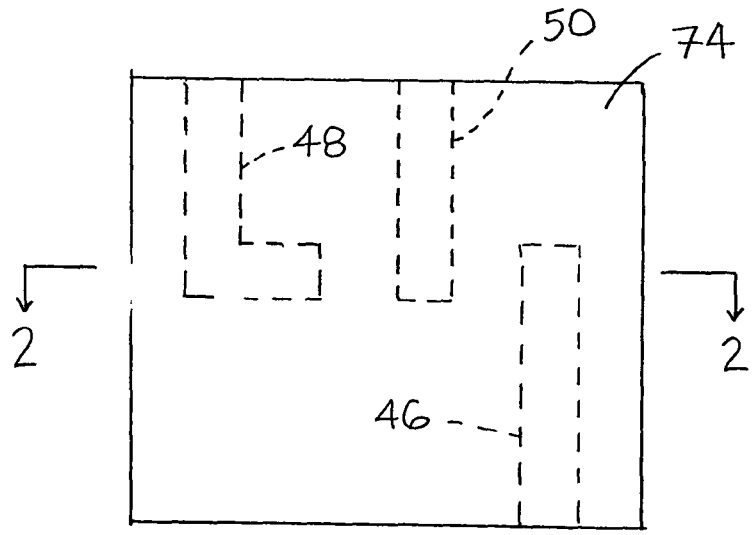
FIG. 3 is a detailed top view of one embodiment of a device and heat dissipation structure of FIG. 2.

FIG. 3 is a detailed top view of one embodiment of a device 14 and heat dissipation structure 12 of FIG. 2 showing the extension of collector connection trench 46, base connection trench 48 and emitter connection trench 50. Of course, the configuration shown is one example but other numbers and configurations of the trenches may be utilized in other applications, as will be understood by those skilled in the art.

A method of manufacturing heat dissipation structure 12 will now be described. First, a mesa 30 may be provided having a side surface 68 and a top surface 66. A thermally conductive material, such as layers 74 and 72, may be placed on side surface 68 and on top surface 66. The thermally conductive material may then be thermally connected to a circuit substrate 22 so as to define a path 82 of heat dissipation that extends in a direction opposite from base layer 36, collector layer 34, and device substrate 28.

Figure 4A:
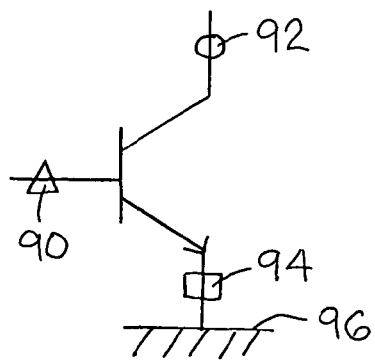
FIGS. 4A-4D are schematics of connection structures of the present invention.
Figure 4B:
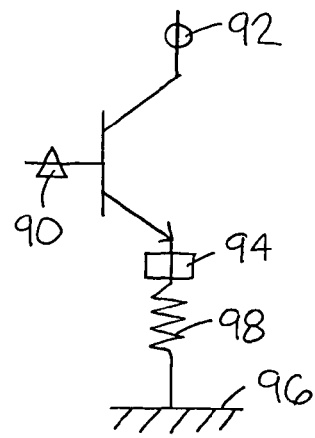
Figure 4C:
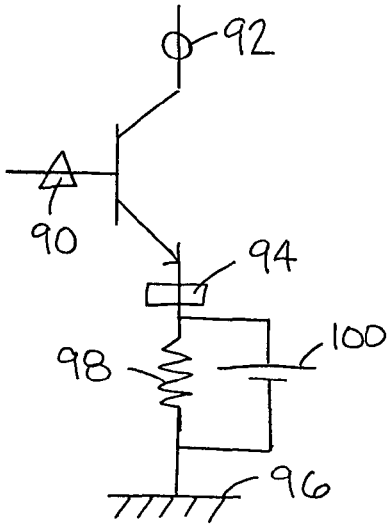
Figure 4D:
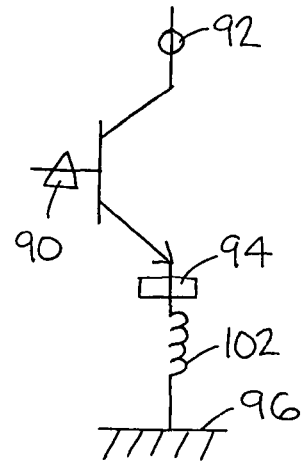

FIGS. 4A-4D are schematics of some example connection structures of the present invention. FIG. 4A shows a base 90 connected to a collector 92 and to a ground 96 through an emitter 94. FIG. 4B shows base 90 connected to collector 92 and to ground 96 through emitter 94 and a resistor 98 in series. FIG. 4C shows base 90 connected to collector 92 and to ground 96 through emitter 94 in series with resistor 98 and a capacitor 100 connected in parallel. FIG. 4D shows base 90 connected to collector 92 and to ground 96 through emitter 94 in series with an inductor 102.

Other variations and modifications of the concepts described herein may be utilized and fall within the scope of the claims below.

I claim:

1. A semiconductor device, that includes an integrated circuit with a horizontally and vertically continuous heat dissipation structure mounted on a printed circuit board, the semiconductor device comprising:

a plurality of discrete power transistors each formed on a discrete device substrate and each including a mesa positioned thereon, each of said mesas extending upwardly from said device substrate so as to define a mesa top surface opposite the device substrate and a side mesa surface between the mesa top surface and the device substrate, wherein a first discrete device substrate of a first discrete power transistor is separate from a second discrete device substrate of a second discrete power transistor;

the printed circuit board positioned opposite said mesas from said device substrates; and the continuous heat dissipation structure positioned on and extending completely across said top surface of each mesa and fully between the side surfaces of the mesas of adjacent ones of the discrete powered transistors and the discrete device substrates of each of the discrete power transistors with an absence of air gaps such that each of the discrete device substrates is insulated from another one of the discrete device substrates by the continuous heat dissipation structure, and fully between each of the discrete power transistors and the printed circuit board with an absence of air gaps such that said heat dissipation structure and said mesas together define an integrated structure that defines a smooth contact surface that contacts a smooth contact surface of said printed circuit board continuously across a width of each of said discrete power transistors, said heat dissipation structure defining a heat dissipation path from each of said mesas to said printed circuit board, wherein said heat dissipation structure includes an electrically insulative layer that fully covers said top surface of each mesa.

2. A semiconductor device according to claim 1 wherein said mesas are electrically isolated from one another through said heat dissipation structure.

3. A semiconductor device according to claim 1 wherein each of said mesas include a subcollector layer, a collector layer, a base layer, an emitter layer and an emitter contact layer.

4. A semiconductor device according to claim 1, wherein the heat dissipation structure includes separate thermally conductive and electrically substantially non-conductive portions that cover the respective top surfaces of the mesas and a thermally and electrically conductive portion disposed between the side surfaces of the mesas of adjacent transistors, wherein the electrically insulative layer that fully covers said top surface of each mesa is the thermally conductive and electrically substantially non-conductive portion.

5. A semiconductor device according to claim 4, wherein the thermally and electrically conductive portion is manufactured of a material chosen from the group including gold, aluminum, and copper.

6. A semiconductor device according to claim 4 wherein said thermally conductive and electrically substantially non-conductive layer is manufactured of a material chosen from the group including GaAs, InP, SiC and Si.

7. A device according to claim 1 wherein each mesa top surface includes a metal bump disposed between each mesa and the continuous heat dissipation structure.

8. A device according to claim 1 wherein the continuous heat dissipation structure defines a height of at least 35 micrometers.

* * * * *